United States Patent
Kubota (10) Patent No.: US 12,431,377 B2
(45) Date of Patent: Sep. 30, 2025

(54) SUBSTRATE STORAGE CONTAINER

(71) Applicant: MIRAIAL CO., LTD., Tokyo (JP)

(72) Inventor: Kouji Kubota, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 406 days.

(21) Appl. No.: 17/999,368

(22) PCT Filed: May 19, 2020

(86) PCT No.: PCT/JP2020/019740
§ 371 (c)(1),
(2) Date: Nov. 18, 2022

(87) PCT Pub. No.: WO2021/234809
PCT Pub. Date: Nov. 25, 2021

(65) Prior Publication Data
US 2023/0238265 A1     Jul. 27, 2023

(51) Int. Cl.
*H01L 21/673*     (2006.01)
*B65D 85/30*     (2006.01)
*H01L 21/677*     (2006.01)

(52) U.S. Cl.
CPC ........ *H01L 21/67769* (2013.01); *B65D 85/30* (2013.01); *H01L 21/67742* (2013.01); *H01L 21/67766* (2013.01)

(58) Field of Classification Search
CPC ......... H01L 21/67369; H01L 21/67383; H01L 21/67373; H01L 21/67376; H01L 21/3732;
(Continued)

(56) References Cited

U.S. PATENT DOCUMENTS

2012/0103860 A1*    5/2012    Masuko ............ H01L 21/67366
                                                                             206/524.6
2013/0319907 A1*   12/2013    Gregerson ........ H01L 21/67376
                                                                              206/711
(Continued)

FOREIGN PATENT DOCUMENTS

JP          11-115985 A     4/1999
JP        2016-048757 A     4/2016
(Continued)

OTHER PUBLICATIONS

English Translation of JP2016048757, accessed on Feb. 11, 2025 (Year: 2016).*

*Primary Examiner* — King M Chu
(74) *Attorney, Agent, or Firm* — MUNCY, GEISSLER, OLDS & LOWE, P.C.

(57) ABSTRACT

A substrate storage container according to the present invention is configured such that: a substrate W slides with respect to a second contact surface 601 at least when transitioning from a state in which an container body opening is not closed by a lid to a state in which the container body opening is closed by the lid, or when transitioning from a state in which the container body opening is closed by the lid to a state in which the container body opening is not closed by the lid; and an inner-side substrate support part 6 is composed of an alloy resin mainly containing a polycarbonate resin and polybutylene terephthalate resin, with the mass of the polybutylene terephthalate resin being greater than the mass of the polycarbonate resin.

4 Claims, 10 Drawing Sheets

(58) Field of Classification Search
CPC ......... H01L 21/37379; H01L 21/37386; H01L 21/37323; H01L 21/37346; B65D 2585/86; B65D 43/02; B65D 85/30; B65D 25/103; G03F 1/66
USPC .................. 206/711, 454, 710, 723, 832
See application file for complete search history.

(56) References Cited

U.S. PATENT DOCUMENTS

2014/0367307 A1\* 12/2014 Oyama ............. H01L 21/67383
                                                                                 206/711
2018/0068882 A1    3/2018 Kato et al.

FOREIGN PATENT DOCUMENTS

| JP | 6372871 B2 | 8/2018 |
|---|---|---|
| TW | 201641585 A | 12/2016 |
| TW | 201834119 A | 9/2018 |
| WO | WO2016163166 A1 | 10/2013 |

\* cited by examiner

| No. | 1 | 2 | 3 | 4 | 5 | 6 | 7 | 8 | 9 | 10 | 11 |
|-----|---|---|---|---|---|---|---|---|---|----|----|
| PBT | 10 | 9 | 8 | 7 | 6 | 5 | 4 | 3 | 2 | 1 | 0 |
| PC | 0 | 1 | 2 | 3 | 4 | 5 | 6 | 7 | 8 | 9 | 10 |

FIG. 9

| | ALLOY RATIO (No.) | | | | | | | | | | |
|---|---|---|---|---|---|---|---|---|---|---|---|
| | 1 | 2 | 3 | 4 | 5 | 6 | 7 | 8 | 9 | 10 | 11 |
| SAMPLE 1 | ○ | ○ | ○ | ○ | ○ | ○ | ○ | × | ○ | × | × |
| SAMPLE 2 | ○ | ○ | ○ | ○ | ○ | ○ | ○ | ○ | ○ | × | × |
| SAMPLE 3 | ○ | ○ | ○ | ○ | ○ | ○ | × | × | × | × | × |
| SAMPLE 4 | ○ | ○ | ○ | ○ | ○ | ○ | ○ | ○ | × | × | × |
| SAMPLE 5 | ○ | ○ | ○ | ○ | ○ | ○ | ○ | × | × | × | × |

FIG. 10

| | ALLOY RATIO (No.) | | | | | | | | | | |
|---|---|---|---|---|---|---|---|---|---|---|---|
| | 1 | 2 | 3 | 4 | 5 | 6 | 7 | 8 | 9 | 10 | 11 |
| SAMPLE 1 | × | × | ○ | ○ | ○ | ○ | ○ | ○ | ○ | ○ | ○ |
| SAMPLE 2 | × | ○ | ○ | ○ | ○ | ○ | ○ | ○ | ○ | ○ | ○ |
| SAMPLE 3 | × | ○ | ○ | ○ | ○ | ○ | ○ | ○ | ○ | ○ | ○ |
| SAMPLE 4 | × | × | ○ | ○ | ○ | ○ | ○ | ○ | ○ | ○ | ○ |
| SAMPLE 5 | × | ○ | ○ | ○ | ○ | ○ | ○ | ○ | ○ | ○ | ○ |

SUBSTRATE STORAGE CONTAINER

TECHNICAL FIELD

The present invention relates to a substrate storing container for use in storing, keeping, conveying, transporting, and the like substrates composed of semiconductor wafers or the like.

BACKGROUND ART

As a substrate storing container for storing and conveying substrates composed of semiconductor wafers, one has been known conventionally that includes a container main body and a wafer carrier (see Patent Document 1).

One end portion of the container main body has an opening circumferential portion in which a container main body opening portion is formed. The other end portion of the container main body has a closed tubular wall portion. A substrate storing space is formed in the container main body. The substrate storing space is formed by being surrounded by the wall portion and can store a plurality of substrates. The lid body can be removably attached to the opening circumferential portion and can close the container main body opening portion. Side substrate support portions are provided on the wall portion so as to form a pair in the substrate storing space. When the container main body opening portion is not closed by the lid body, the side substrate support portions can support edge portions of the plurality of substrates in a state in which adjacent substrates are spaced apart from each other by a predetermined interval and arranged in parallel.

A front retainer is provided at a part of the lid body that faces the substrate storing space when the container main body opening portion is closed. The front retainer includes a lid body side substrate receiving portion that directly abuts with and supports the substrate and a lid body side leg portion that supports the lid body side substrate receiving portion, and can support edge portions of the plurality of substrates when the container main body opening portion is closed by the lid body. Further, a back side substrate support portion is provided on the wall portion so as to form a pair with the front retainer. The back side substrate support portion can support edge portions of the plurality of substrates. The back side substrate support portion supports the plurality of substrates in cooperation with the front retainer when the container main body opening portion is closed by the lid body, and thereby retains the plurality of substrates in a state in which adjacent substrates are spaced apart from each other by a predetermined interval and are arranged in parallel.

Patent Document 1: Japanese Patent No. 6372871

DISCLOSURE OF THE INVENTION

Problems to be Solved by the Invention

As described above, when the container main body opening portion is closed by the lid body, to suppress breakage or rotation of the substrate, the back side substrate support portion retains and fixes the plurality of substrates in a state in which the adjacent substrates are spaced apart from each other by a predetermined interval by sandwiching and supporting the plurality of substrates in cooperation with the front retainer.

When the friction coefficient of the material constituting the back side substrate support portion is low, even if the substrate is held by a strong force, the substrate will rotate due to vibration or the like during transportation of the substrate storing container, and contamination due to generation of particles is likely to occur. When the friction coefficient of the material constituting the back side substrate support portion is high, even if the substrate is held by a light force, the substrate will not rotate easily due to vibration or the like during transportation, and contamination due to generation of particles is small.

However, in the case of a configuration in which when the friction coefficient of the material constituting the back side substrate support portion is high, and when a state in which the container main body opening portion is closed by the lid body is changed to a state in which the container main body opening portion is not closed by the lid body, an end edge of the substrate slides on the back side substrate support portion and moves to a predetermined position at which the substrate is to be removed, the end edge of the substrate cannot smoothly slide on the back side substrate support portion and cannot move to the predetermined position at which the substrate is to be removed. This causes an issue that a substrate transfer machine cannot automatically remove the substrate.

It is an object of the present invention to provide a substrate storing container capable of allowing a substrate to be reliably moved to a predetermined position at which the substrate is to be removed, capable of allowing the substrate to be automatically removed by a substrate transfer machine, and suppressing contamination due to generation of particles.

Means for Solving the Problems

The present invention relates to a substrate storing container including a container main body, a lid body, a lid body side substrate support portion, and a back side substrate support portion. The container main body has a tubular wall portion having an opening circumferential portion provided at one end portion and the other end portion being closed. The opening circumferential portion has a container main body opening portion formed therein. The wall portion has an inner face forming a substrate storing space capable of storing a plurality of substrates and communicating with the container main body opening portion. The lid body is removably attached to the container main body opening portion and is capable of closing the container main body opening portion. The lid body side substrate support portion is disposed on a part of the lid body that faces the substrate storing space and is capable of supporting edge portions of the plurality of substrates when the container main body opening portion is closed by the lid body. The back side substrate support portion is disposed so as to form a pair with the lid body side substrate support portion in the substrate storing space, is capable of supporting edge portions of the plurality of substrates, and supporting the plurality of substrates in a state in which the plurality of substrates are arranged in parallel, in cooperation with the lid body side substrate support portion when the container main body opening portion is closed by the lid body. The back side substrate support portion includes a first abutting portion having a first abutting face capable of abutting with an end edge of a front side of one of the plurality of substrates and a second abutting portion having a second abutting face capable of abutting with an end edge of a back side of the one of the plurality of substrates, the second abutting face being connected to the first abutting face. The one of the plurality of substrates slides on the second abutting face at least when a state in which the container main body opening portion is not closed by the lid body is changed to a state in which the container main body opening portion is closed by the lid body or when the state in which the container main body opening portion is closed by the lid body is changed to the state in which the container main body opening portion is not closed by the lid body. The back side substrate support portion includes an alloy resin mainly composed of a polycarbonate resin and a polybutylene terephthalate resin. A mass of the polybutylene terephthalate resin is greater than that of the polycarbonate resin.

A material constituting the back side substrate support portion preferably includes the polybutylene terephthalate resin in an amount of 51% by mass or more with respect to a mass of the alloy resin.

The back side substrate support portion includes the alloy resin mainly composed of the polycarbonate resin and the polybutylene terephthalate resin, and preferably contains the polybutylene terephthalate resin in an amount of 51% by mass or more and less than 90% by mass with respect to the mass of the alloy resin.

It is preferable that the substrate storing container further includes side substrate support portions disposed to form a pair in the substrate storing space. The side substrate support portions are capable of supporting edge portions of the plurality of substrates in a state in which adjacent substrates among the plurality of substrates are spaced apart from each other by a predetermined interval and arranged in parallel when the container main body opening portion is not closed by the lid body. The back side substrate support portion preferably supports the plurality of substrates in a state in which the edge portions of the plurality of substrates are separated from the side substrate support portions and are arranged in parallel, in cooperation with the lid body side substrate support portion when the container main body opening portion is closed by the lid body.

It is preferable that the first abutting face and the second abutting face support the one of the plurality of substrates so as to sandwich an end edge of the one of the plurality of substrates when the container main body opening portion is closed by the lid body.

Effects of the Invention

According to the present invention, it is possible to provide a substrate storing container capable of allowing a substrate to be reliably moved to a predetermined position at which the substrate is to be removed, and capable of allowing the substrate to be automatically removed by a substrate transfer machine.

PREFERRED MODE FOR CARRYING OUT THE INVENTION

Figure 1:
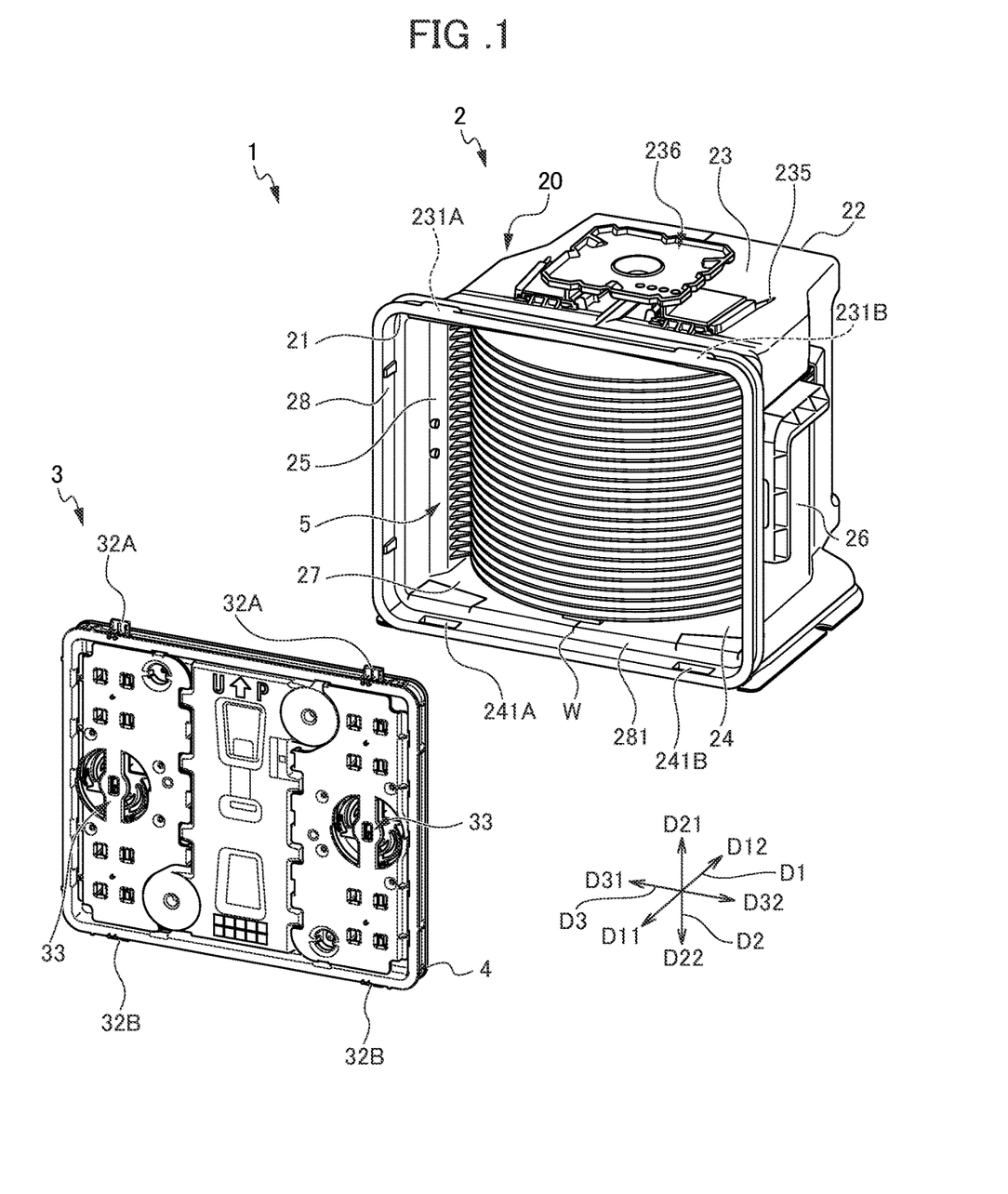
FIG. 1 is an exploded perspective view showing a state in which a plurality of substrates W are stored in a substrate storing container 1 according to an embodiment of the present invention.
Figure 2:
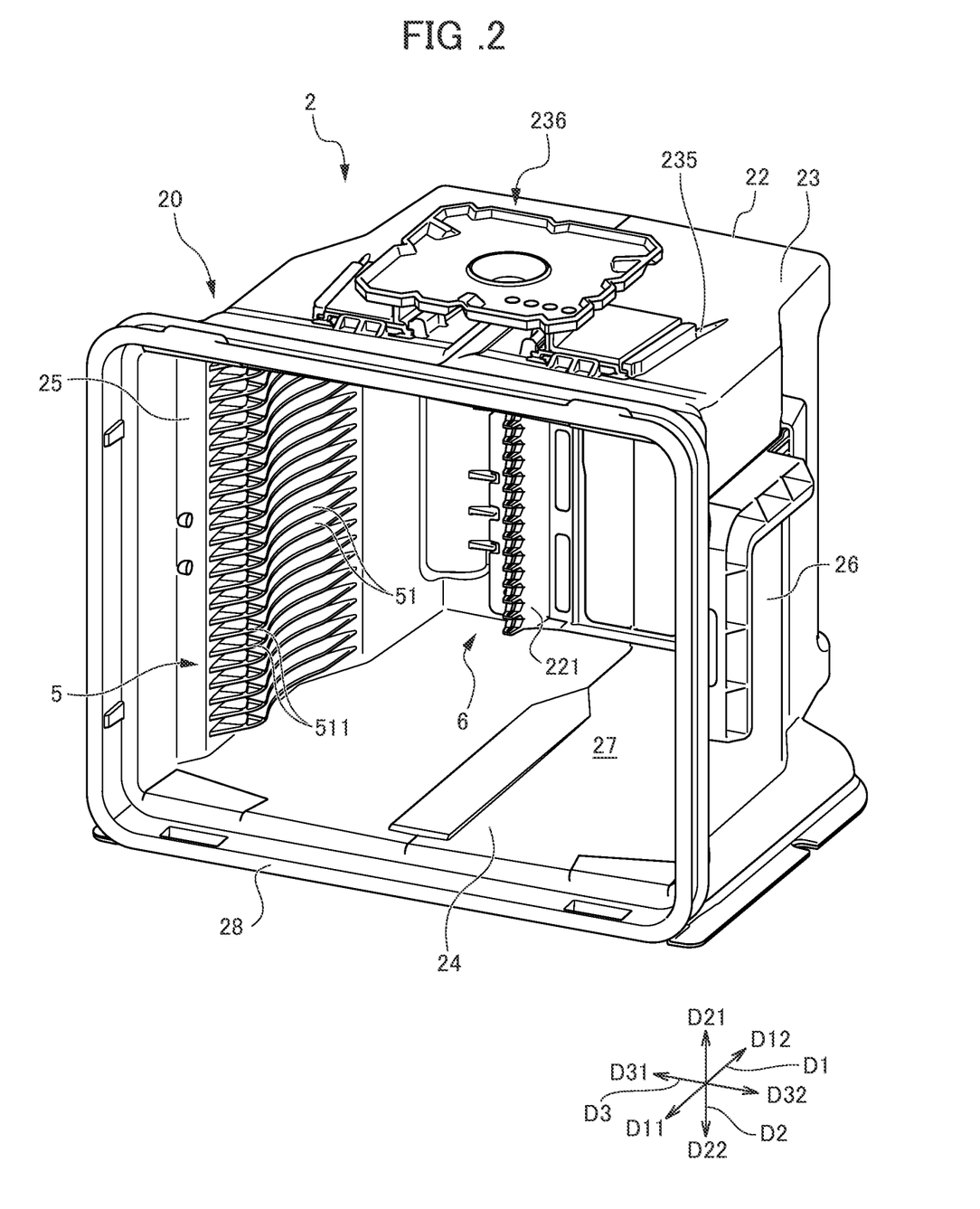
FIG. 2 is a perspective view of a container main body 2 of the substrate storing container 1 according to the embodiment of the present invention.
Figure 3:
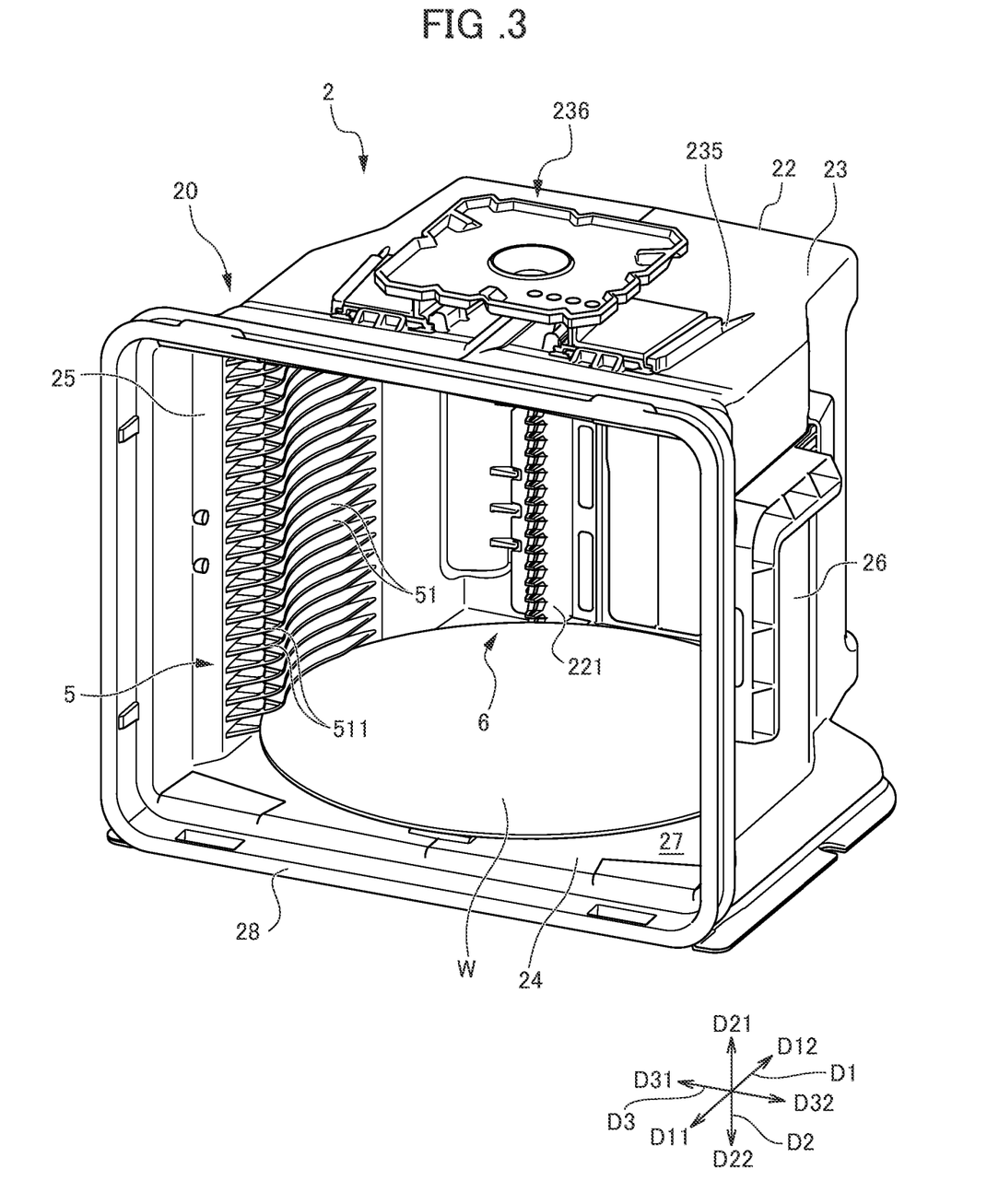
FIG. 3 is an exploded perspective view showing a state in which one substrate W is stored in the container main body 2 of the substrate storing container 1 according to the embodiment of the present invention.
Figure 4:
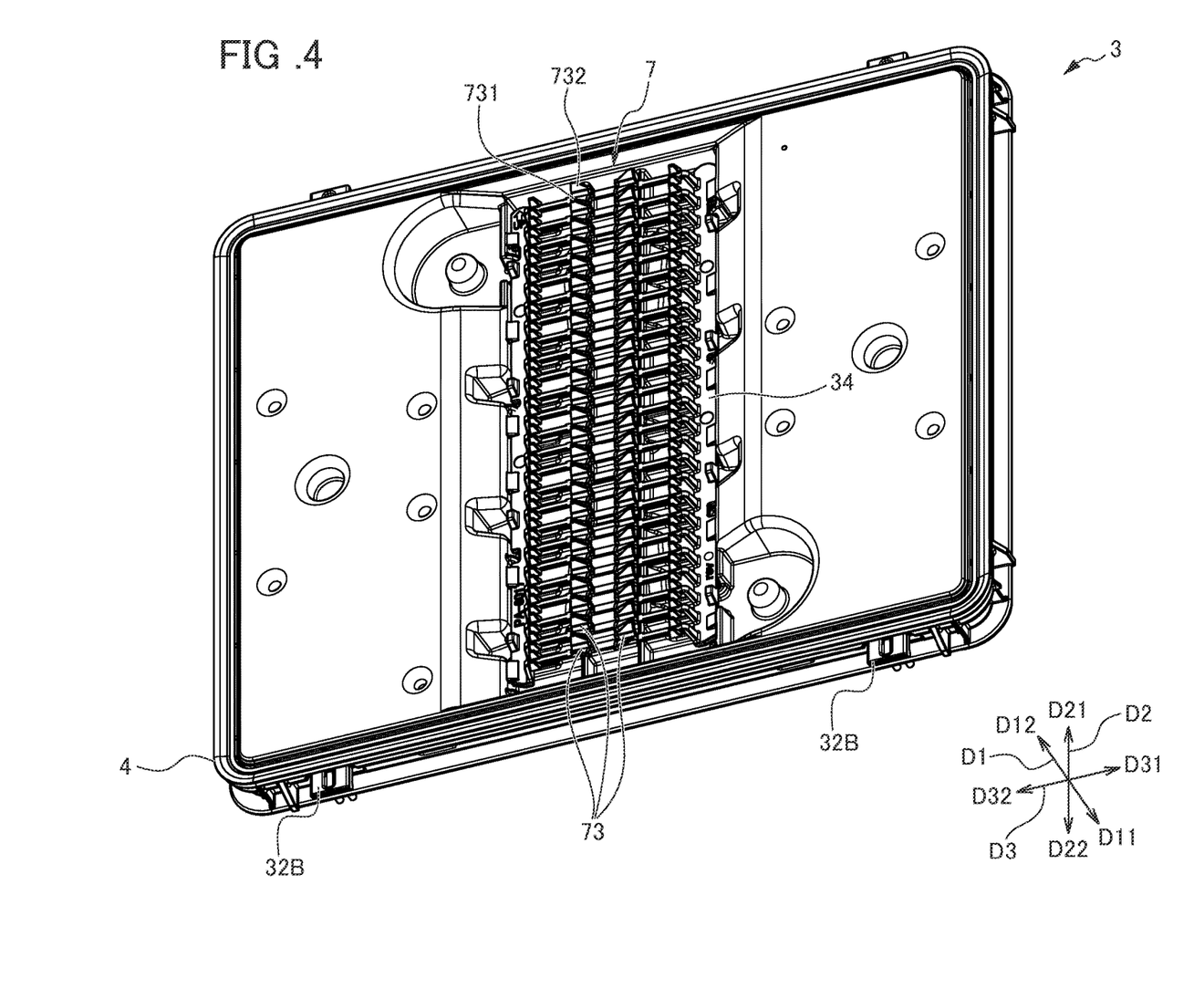
FIG. 4 is a perspective view of a lid body 3 of the substrate storing container 1 according to the embodiment of the present invention.

Hereinafter, a substrate storing container 1 according to the present embodiment will be described with reference to the drawings. FIG. 1 is an exploded perspective view showing a state in which a plurality of substrates W are stored in the substrate storing container 1 according to an embodiment of the present invention. FIG. 2 is a perspective view of a container main body 2 of the substrate storing container 1 according to the embodiment of the present invention. FIG. 3 is an exploded perspective view showing a state in which one substrate W is stored in the container main body 2 of the substrate storing container 1 according to the embodiment of the present invention. FIG. 4 is a perspective view of a lid body 3 of the substrate storing container 1 according to the embodiment of the present invention.

Herein, for the purpose of illustration, the direction from the container main body 2 (described later) to the lid body 3 (described later) (direction from the upper right to the lower left in FIG. 1) is defined as a forward direction D11 and the direction opposite to the direction D11 is defined as a backward direction D12. These directions are collectively defined as a forward/backward direction D1. In addition, the direction from a lower wall 24 (described later) to an upper wall 23 (described later) (upper direction in FIG. 1) is defined as an upper direction D21 and the direction opposite to the direction D21 is defined as a lower direction D22. These directions are collectively defined as an upper/lower direction D2. Moreover, the direction from a second side wall 26 (described later) to a first side wall 25 (described later) (direction from the lower right to the upper left in FIG. 1) is defined as a left direction D31 and the direction opposite to the direction D31 is defined as a right direction D32. These directions are collectively defined as a left/right direction D3. The main drawings show arrows indicating these directions.

The substrate W (see FIG. 1) stored in the substrate storing container 1 is a disk-like silicon wafer, glass wafer, sapphire wafer, or the like, and is a thin wafer used in industrial applications. The substrate W in the present embodiment is a silicon wafer having a diameter of 300 mm.

As shown in FIG. 1, the substrate storing container 1 is used as a shipping container for storing the substrates W composed of a silicon wafer as described above and transporting the substrates W by transport means such as land transport means, air transport means, or sea transport means. The substrate storing container 1 includes the container main body 2 and the lid body 3. The container main body 2 includes a substrate support plate-like portion 5 as a side substrate support portion and a back side substrate support portion 6 (see FIG. 2, etc.). The lid body 3 includes a front retainer 7 (see FIG. 4, etc.) as a lid body side substrate support portion.

The container main body 2 includes a tubular wall portion 20 having a container main body opening portion 21 formed at one end portion and the other end portion being closed. A substrate storing space 27 is formed in the container main body 2. The substrate storing space 27 is formed to be surrounded by the wall portion 20. The substrate support plate-like portion 5 is disposed at a part of the wall portion 20 that forms the substrate storing space 27. As shown in FIG. 1, the plurality of substrates W can be stored in the substrate storing space 27.

The substrate support plate-like portions 5 are provided on the wall portion 20 so as to form a pair in the substrate storing space 27. When the container main body opening portion 21 is not closed by the lid body 3, the substrate support plate-like portions 5 can support edge portions of the plurality of substrates W by abutting with the edge portions of the plurality of substrates W in a state in which adjacent substrates W are spaced apart from each other by a predetermined interval and arranged in parallel. The back side substrate support portion 6 is provided at the back side of the substrate support plate-like portion 5.

The back side substrate support portion 6 is provided on the wall portion 20 so as to form a pair with the front retainer 7 (described later) in the substrate storing space 27. When the container main body opening portion 21 is closed by the lid body 3, the back side substrate support portion 6 can support the rear edge portions of the plurality of substrates W by abutting with the edge portions of the plurality of substrates W.

The lid body 3 can be removably attached to an opening circumferential portion 28 (see FIG. 1, etc.) forming the container main body opening portion 21 and can close the container main body opening portion 21. The front retainer 7 is provided at a part of the lid body 3 that faces the substrate storing space 27 when the container main body opening portion 21 is closed by the lid body 3. The front retainer 7 is disposed so as to form a pair with the back side substrate support portion 6 in the substrate storing space 27.

When the container main body opening portion 21 is closed by the lid body 3, the front retainer 7 can support the front edge portions of the plurality of substrates W by abutting with the edge portions of the plurality of substrates W. When the container main body opening portion 21 is closed by the lid body 3, the front retainer 7 supports the plurality of substrates W in cooperation with the back side substrate support portion 6, thereby retaining the plurality of substrates W in a state in which the adjacent substrates W are spaced apart from each other by a predetermined interval and arranged in parallel.

The substrate storing container 1 includes a resin such as a plastic material. If not specifically described, examples of the resin include thermoplastic resins such as polycarbonate, cycloolefin polymer, polyetherimide, polyetherketone, polybutylene terephthalate, polyetheretherketone, and liquid crystal polymer, and alloys thereof. In the case of imparting conductivity to these resins that are molding materials, conductive materials such as carbon fibers, carbon powder, carbon nanotubes, and conductive polymers are selectively added. It is also possible to add glass fibers, carbon fibers, or the like to increase the rigidity.

Figure 5:
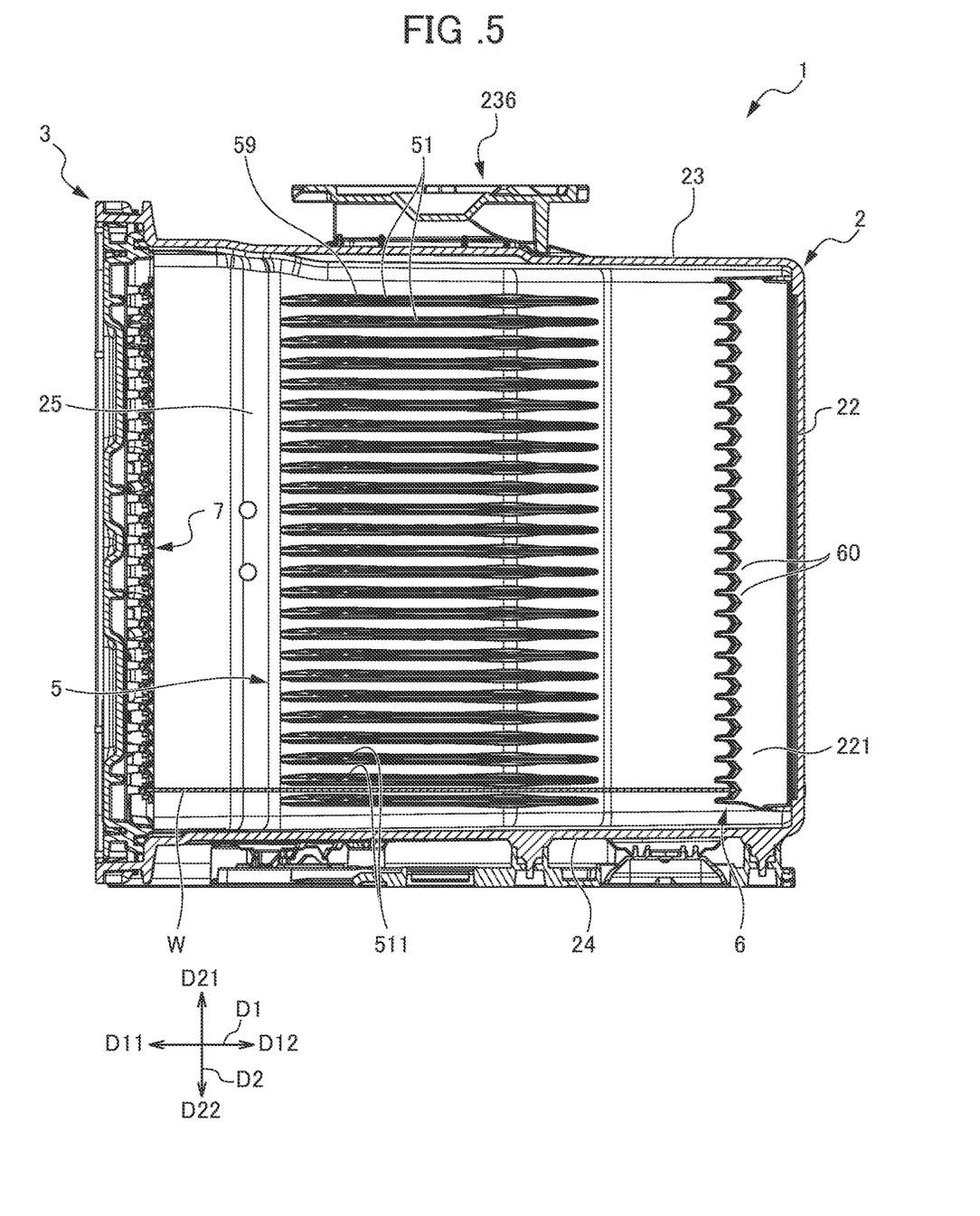
FIG. 5 is a sectional view of the substrate storing container 1 according to the embodiment of the present invention.
Figure 6:
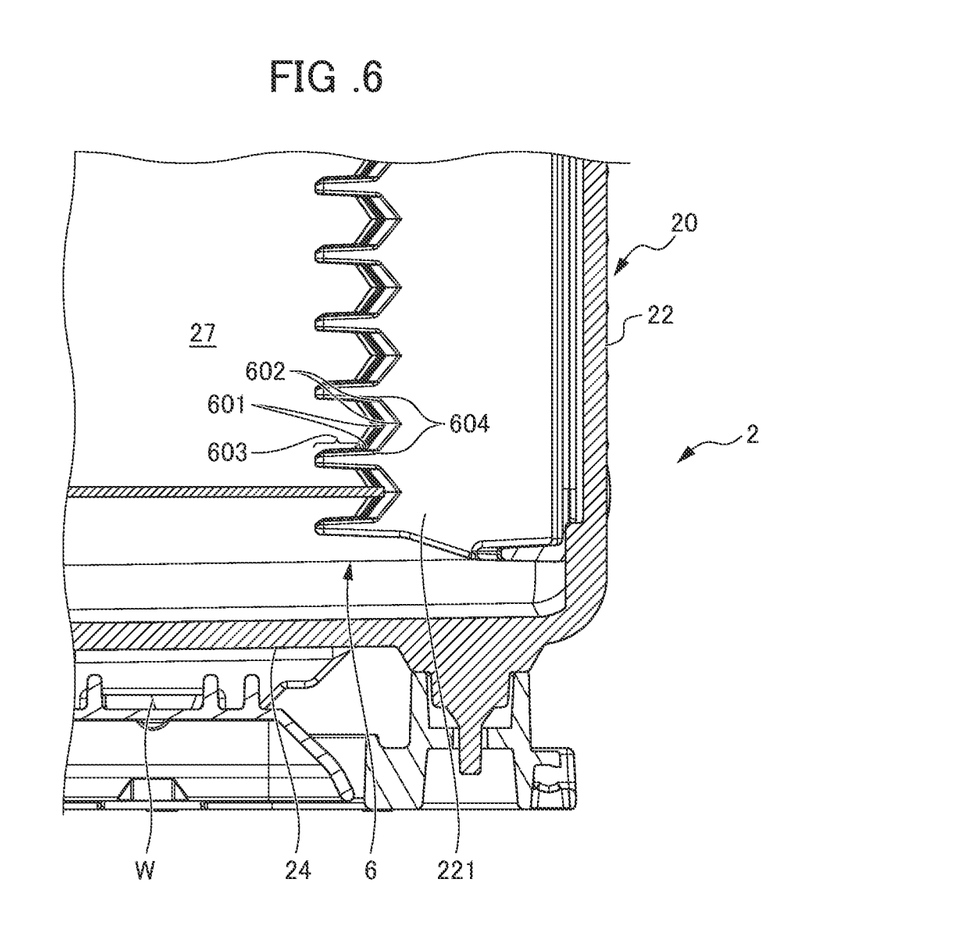
FIG. 6 is an enlarged sectional view showing a positional relationship between a back side substrate support portion 6 and the substrate W when a container main body opening portion 21 is closed by the lid body 3 of the substrate storing container 1 according to the embodiment of the present invention.
Figure 7:
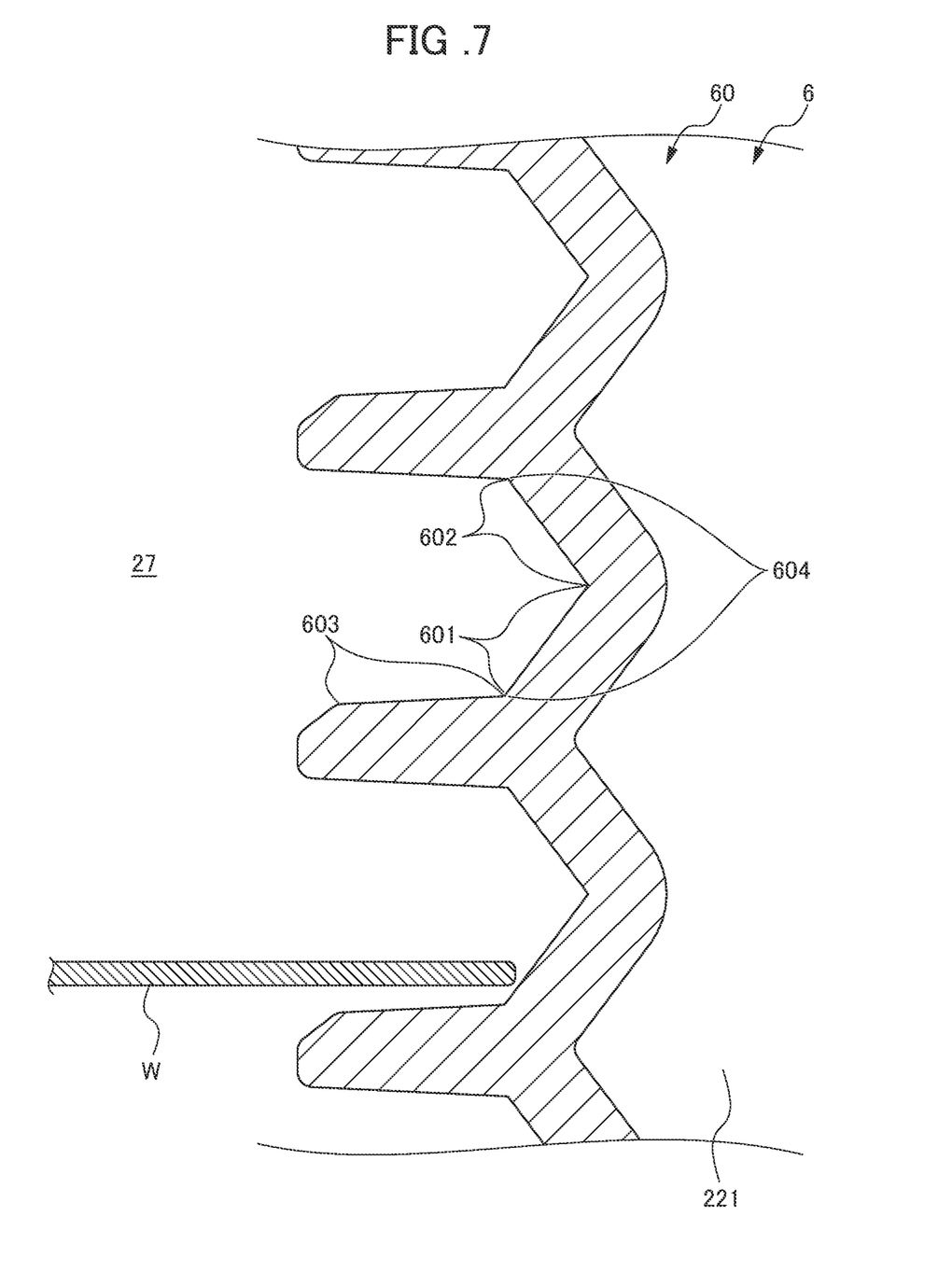
FIG. 7 is an enlarged sectional view showing a positional relationship between the back side substrate support portion 6 and the substrate W when the container main body opening portion 21 is not closed by the lid body 3 of the substrate storing container 1 according to the embodiment of the present invention.

Hereinafter, each portion will be described in detail. FIG. 5 is a sectional view of the substrate storing container 1 according to the embodiment of the present invention. FIG. 6 is an enlarged sectional view of a positional relationship between the back side substrate support portion 6 and the substrate W when the container main body opening portion 21 is closed by the lid body 3 of the substrate storing container 1 according to the embodiment of the present invention. FIG. 7 is an enlarged sectional view showing a positional relationship between the back side substrate support portion 6 and the substrate W when the container main body opening portion 21 is not closed by the lid body 3 of the substrate storing container 1 according to the embodiment of the present invention.

As shown in FIG. 1, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 includes the above-described material and are integrally formed.

The first side wall 25 faces the second side wall 26, and the upper wall 23 faces the lower wall 24. The rear edge of the upper wall 23, the rear edge of the lower wall 24, the rear edge of the first side wall 25, and the rear edge of the second side wall 26 are all connected to the back wall 22. The front edge of the upper wall 23, the front edge of the lower wall 24, the front edge of the first side wall 25, and the front edge of the second side wall 26 have a positional relationship opposite the back wall 22, and constitute the opening circumferential portion 28 that forms the container main body opening portion 21 having a substantially rectangular shape.

The opening circumferential portion 28 is provided at one end portion of the container main body 2, and the back wall 22 is located at the other end portion of the container main body 2. The outer shape of the container main body 2 formed by the outer faces of the wall portion 20 is a box shape. The inner faces of the wall portion 20, i.e., the inner face of the back wall 22, the inner face of the upper wall 23, the inner face of the lower wall 24, the inner face of the first side wall 25, and the inner face of the second side wall 26, form the substrate storing space 27, which is surrounded thereby. The container main body opening portion 21 formed in the opening circumferential portion 28 is in communication with the substrate storing space 27 surrounded by the wall portion 20 and formed inside the container main body 2. The substrate storing space 27 can store a maximum of 25 substrates W.

As shown in FIG. 1, latch engagement concave portions 231A, 231B, 241A, and 241B, which are recessed outward of the substrate storing space 27, are formed at parts of the upper wall 23 and the lower wall 24 that are proximal to the opening circumferential portion 28. A total of four latch engagement concave portions 231A, 231B, 241A, and 241B are respectively formed near the right and left ends of the upper wall 23 and the lower wall 24.

As shown in FIG. 1, a rib 235 is provided so as to be integrally formed with the upper wall 23 at the outer face of the upper wall 23. The rib 235 increases the rigidity of the container main body 2. A top flange 236 is fixed to the central portion of the upper wall 23. The top flange 236 is a member corresponding to a part of the substrate storing container 1 from which it is hung to be suspended when suspending the substrate storing container 1 by an automated material handling system (AMHS), a person guided vehicle (PGV), etc.

The substrate support plate-like portions 5 are formed integrally with the first side wall 25 and the second side wall 26, respectively, and are provided in the substrate storing space 27 so as to form a pair in the left/right direction D3. Specifically, as shown in FIG. 5, etc., the substrate support plate-like portion 5 includes a plate portion 51.

As shown in FIG. 3, the plate portion 51 has a plate-like substantially arc shape. A total of 50 plate portions 51 are provided, 25 on each of the first side wall 25 and the second side wall 26 in the upper/lower direction D2. Adjacent plate portions 51 are arranged in parallel, spaced apart from each other by an interval of 10 mm to 12 mm in the upper/lower direction D2. In addition, a plate-like member 59 is arranged above the uppermost plate portion 51 and in parallel with the plate portions 51. This member serves as a guide for inserting the uppermost substrate W into the substrate storing space 27.

The 25 plate portions 51 provided on the first side wall 25 and the 25 plate portions 51 provided on the second side wall 26 are opposed to each other in the left/right direction D3. The 50 plate portions 51 and the members 59 serving as the plate-like guides parallel to the plate portions 51 are parallel to the inner face of the lower wall 24. As shown in FIGS. 2, 3, etc., a convex portion 511 is provided on the upper face of the plate portion 51. The substrate W supported by the plate portion 51 contacts only the projecting end of the convex portion 511, and does not contact the face of the plate portion 51.

The substrate support plate-like portions 5 with such a configuration can support the edge portions of the plurality of substrates W in a state in which adjacent substrates W among the plurality of substrates W are spaced apart from each other by a predetermined interval and arranged in parallel with each other.

As shown in FIG. 2, etc., the back side substrate support portion 6 is formed on a rib-shaped portion 221 provided on the back wall 22. The rib-shaped portion 221 projects inward of the substrate storing space 27 on the inner face of the back wall 22. The back side substrate support portion 6 is formed on the inner face of the rib-shaped portion 221 projecting inward of the substrate storing space 27, and includes a back side end edge support portion 60 (see FIG. 5, etc.).

The number of the back side end edge support portions 60 corresponds to the number of the substrates W that can be stored in the substrate storing space 27, and more specifically, the number of the back side end edge support portions 60 is 25. The back side end edge support portion 60 provided on the back wall 22 has a positional relationship so as to form a pair with the front retainer 7 (described later) in the forward/backward direction D1.

As shown in FIGS. 6 and 7, the back side substrate support portion 6 includes a second abutting portion that has a lower inclined face 601 as a second abutting face, a first abutting portion that has an upper inclined face 602 as a first abutting face, and a lower abutting face 603.

Specifically, the lower inclined face 601 is configured by an inclined face that inclines and extends away from the center of the substrate storing space 27 (left side in FIGS. 6 and 7) toward the upper direction D21. The upper inclined face 602 is configured by an inclined face that inclines and extends closer to the center of the substrate storing space 27 (left side in FIGS. 6 and 7), from the upper end of the lower inclined face 601 toward the upper direction D21. The lower inclined face 601 and the upper inclined face 602 form a V-shaped groove 604 that is recessed away from the center of the substrate storing space 27.

When the container main body opening portion 21 is not closed by the lid body 3 (see FIG. 1, etc.), the end edge of the back side (lower face) of the substrate W abuts with the lower abutting face 603, and the end edge of the back side of the substrate W is placed thereon. When a state in which the container main body opening portion 21 is not closed by the lid body 3 is changed to a state in which the container main body opening portion 21 is closed by the lid body 3, the end edge of the back side of the substrate W is separated from the lower abutting face 603 and slides on the lower inclined face 601, and as shown in FIG. 6, the end edge of the substrate W is sandwiched between and supported by the lower inclined face 601 and the upper inclined face 602 at the deepest part of the V-shaped groove 604. When a state in which the container main body opening portion 21 is closed by the lid body 3 is changed to a state in which the container main body opening portion 21 is not closed by the lid body 3, the end edge of the back side of the substrate W slides on the lower inclined face 601 and abuts with the lower abutting face 603.

As shown in FIG. 1, etc., the lid body 3 has a substantially rectangular shape that substantially matches the shape of the opening circumferential portion 28 of the container main body 2. The lid body 3 can be removably attached to the opening circumferential portion 28 of the container main body 2. By the lid body 3 being attached to the opening circumferential portion 28, the lid body 3 can close the container main body opening portion 21. An annular sealing member 4 is attached to an inner face of the lid body 3 (face on the back side of the lid body 3 shown in FIG. 1) that faces a face (a sealing face 281) of a step portion formed at a position immediately rearward (backward direction D12) of the opening circumferential portion 28 when the lid body 3 closes the container main body opening portion 21. The sealing member 4 includes various types of thermoplastic elastomers such as polyester type and polyolefin type that are elastically deformable, fluorine containing rubber, silicon rubber, or the like. The sealing member 4 is arranged so as to go around an outer edge portion of the lid body 3.

When the lid body 3 is attached to the opening circumferential portion 28, the sealing member 4 is sandwiched between the sealing face 281 and the inner face of the lid body 3 to be elastically deformed, and thus the lid body 3 closes the container main body opening portion 21 in an airtight state. By the lid body 3 being removed from the opening circumferential portion 28, the substrate W can be placed in and removed from the substrate storing space 27 in the container main body 2.

A latching mechanism is provided in the lid body 3. The latching mechanism is provided in the vicinity of both left and right ends of the lid body 3. As shown in FIG. 1, the latching mechanism includes two upper side latch portions 32A that can project from the upper side of the lid body 3 in the upper direction D21 and two lower side latch portions 32B that can project from the lower side of the lid body 3 in the lower direction D22. The two upper side latch portions 32A are respectively arranged in the vicinity of the left and right ends of the upper side of the lid body 3, and the two lower side latch portions 32B are respectively arranged in the vicinity of left and right ends of the lower side of the lid body 3.

An operation portion 33 is provided in an outer face of the lid body 3. By operating the operation portion 33 from the front side of the lid body 3, it is possible to cause the upper side latch portions 32A and the lower side latch portions 32B to project from the upper side and the lower side of the lid body 3, and it is also possible to cause the upper side latch portions 32A and the lower side latch portions 32B not to project from the upper side and the lower side of the lid body 3. By the upper side latch portions 32A projecting from the upper side of the lid body 3 in the upper direction D21 to engage with the latch engagement concave portions 231A and 231B of the container main body 2, and the lower side latch portions 32B projecting from the lower side of the lid body 3 in the lower direction D22 to engage with the latch engagement concave portions 241A and 241B of the container main body 2, the lid body 3 is fixed to the opening circumferential portion 28 of the container main body 2.

As shown in FIG. 4, on the inner side of the lid body 3, a recessed portion 34 that is recessed outward of the substrate storing space 27 is formed. As shown in FIG. 4, the front retainer 7 is fixed to a part of the lid body 3 inside the recessed portion 34.

As shown in FIG. 4, the front retainer 7 includes a front retainer substrate receiving portion 73. The front retainer substrate receiving portions 73 are arranged two by two so as to form a pair and be spaced apart from each other by a predetermined interval in the left/right direction D3. The front retainer substrate receiving portions 73 arranged two by two so as to form a pair as described above are provided in a state in which 25 pairs are arranged in parallel in the upper/lower direction D2, and are respectively supported by leg portions that are elastically deformable. The front retainer substrate receiving portions 73 sandwich and support the end edges of edge portions of the substrates W in a state of biasing them toward the center of the substrate storing space 27 with the elastic force of the leg portions by the substrates W being stored in the substrate storing space 27 and the lid body 3 being closed.

Specifically, as shown in FIG. 4, the front retainer substrate receiving portion 73 has a lower inclined face 731 and an upper inclined face 732.

The lower inclined face 731 abuts with an end edge of the back side of the substrate W when the container main body opening portion 21 is closed by the lid body 3. The upper inclined face 732 abuts with an end edge of the front side of the substrate W. Specifically, the lower inclined face 731 is configured by an inclined face that inclines and extends away from the center of the substrate storing space 27 in the forward/backward direction D1 toward the upper direction D21. The upper inclined face 732 is configured by an inclined face that inclines and extends closer to the center of the substrate storing space 27 in the forward/backward direction D1 toward the upper direction D21. The lower inclined face 731 and the upper inclined face 732 form a V-shaped groove that is recessed away from the center of the substrate storing space 27. The end edge of the back side and the end edge of the front side of the substrate W respectively abut with the lower inclined face 731 and the upper inclined face 732 when the container main body opening portion 21 is closed by the lid body 3.

The back side substrate support portion 6 and the wall portion 20 integrally formed with the back side substrate support portion 6 and constituting the container main body 2 includes an alloy resin mainly composed of a polycarbonate resin and a polybutylene terephthalate resin, and the mass of the polybutylene terephthalate resin is greater than the mass of the polycarbonate resin.

More specifically, the material constituting the back side substrate support portion 6 and the wall portion 20 includes the polybutylene terephthalate resin in an amount of greater than 40% by mass with respect to the mass of the alloy resin. When the amount is greater than 40% by mass, the friction coefficient of the substrate W with respect to the lower inclined face 601 can be lowered, and contamination due to generation of particles can be suppressed. This enables the substrate W to move reliably to a predetermined position at which the substrate W is to be removed, while contamination due to generation of particles is suppressed. Therefore, the substrate transfer machine (not shown) can reliably remove the substrate W automatically.

More preferably, the back side substrate support portion 6 and the wall portion 20 integrally formed with the back side substrate support portion 6 and constituting the container main body 2 includes an alloy resin mainly composed of a polycarbonate resin and a polybutylene terephthalate resin, and contain the polybutylene terephthalate resin in an amount of 51% by mass or more and less than 90% by mass with respect to the mass of the alloy resin. Thus, by making the amount of the polybutylene terephthalate resin 51% by mass or more with respect to the mass of the alloy resin, the friction coefficient of the substrate W with respect to the lower inclined face 601 can be extremely lowered. Therefore, the substrate W can be more reliably moved to a predetermined position at which the substrate W is to be removed. Therefore, the substrate transfer machine (not shown) can automatically remove the substrate W more reliably. Further, by making the amount of the polybutylene terephthalate resin less than 90% by mass with respect to the mass of the alloy resin, contamination due to generation of particles can be reliably suppressed.

Figure 8:
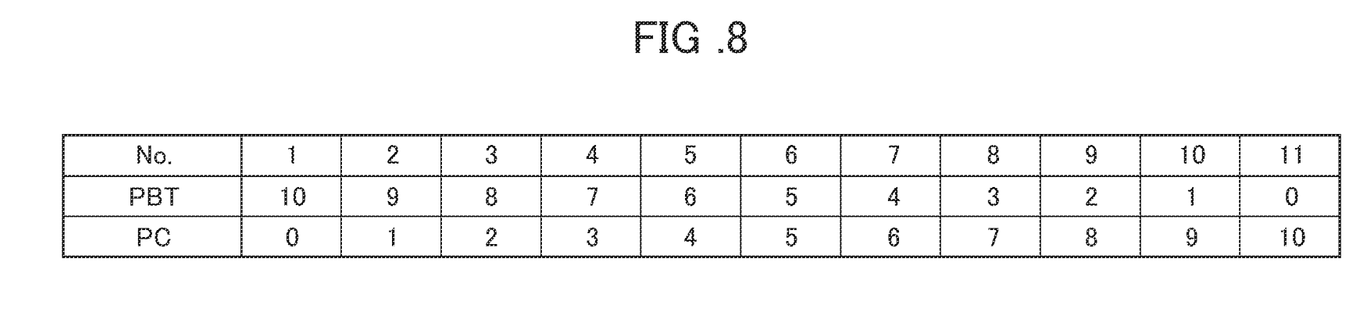
FIG. 8 is a table showing the mass ratios of a polybutylene terephthalate resin (PBT) to a polycarbonate resin (PC) of test products 1 (No. 1) to 11 (No. 11) used in a test for testing the effects of the substrate storing container 1 according to the embodiment of the present invention.
Figure 9:
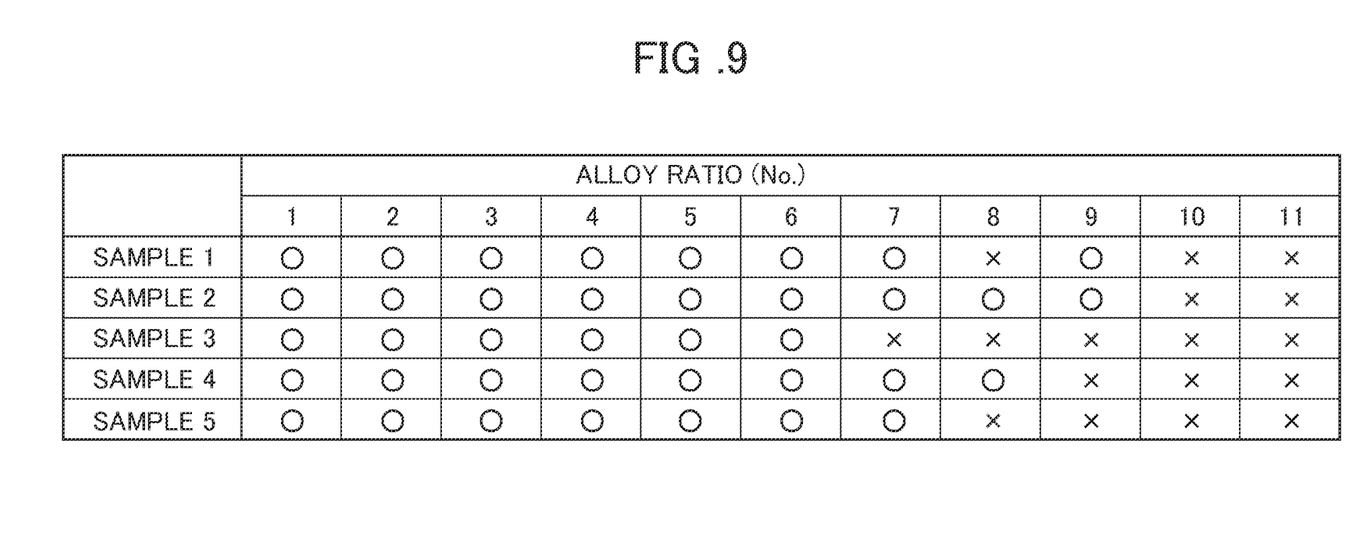
FIG. 9 is a table showing the results of whether test products 1 (No. 1) to 11 (No. 11) used in the test for testing the effects of the substrate storing container 1 according to the embodiment of the present invention can be slid to a position at which a substrate transfer machine can automatically remove the substrate W.
Figure 10:
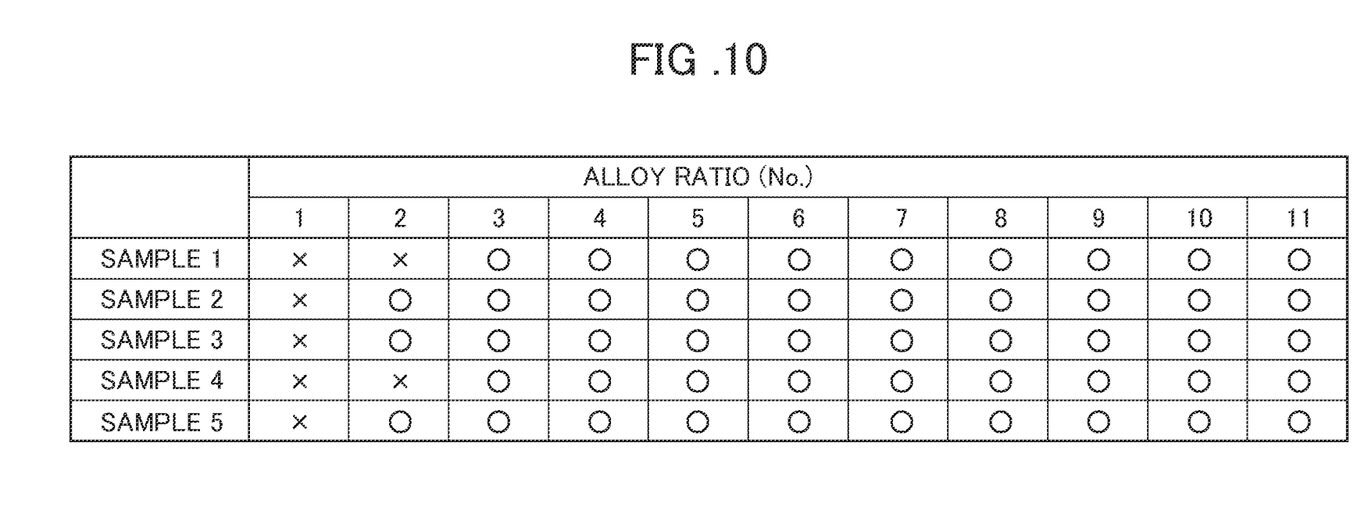
FIG. 10 is a table showing the results of whether contamination due to generation of particles is within a standard range with regard to test products 1 (No. 1) to 11 (No. 11) used in the test for testing the effects of the substrate storing container 1 according to the embodiment of the present invention.

Next, a test was performed to confirm the effects of the substrate storing container 1 according to the present embodiment. FIG. 8 is a table showing the mass ratios of a polybutylene terephthalate resin (PBT) and a polycarbonate resin (PC) of test products 1 (No. 1) to 11 (No. 11) used in the test for testing the effects of the substrate storing container 1 according to the embodiment of the present invention. FIG. 9 is a table showing the results of whether test products 1 (No. 1) to 11 (No. 11) used in the test for testing the effects of the substrate storing container 1 according to the embodiment of the present invention could be slid to a position at which a substrate transfer machine could automatically remove the substrate W. FIG. 10 is a table showing the results of whether contamination due to generation of particles is within a standard range with regard to test products 1 (No. 1) to 11 (No. 11) used in the test for testing the effects of the substrate storing container 1 according to the embodiment of the present invention.

In the test, test products 1 (No. 1) to 11 (No. 11) each consisting of the polybutylene terephthalate resin (PBT) and the polycarbonate resin (PC) at a mass ratio shown in FIG. 8, were produced and tested. Test products 2 (No. 2) to 5 (No. 5) were products of the present invention, and were produced by changing the mass ratios of the polybutylene terephthalate resin (PBT) to the polycarbonate resin (PC). For example, with regard to test product 2 (No. 2), the mass ratio of the polybutylene terephthalate resin (PBT) to the polycarbonate resin (PC) was 9:1. Similarly, for example, with regard to test product 5 (No. 5), the mass ratio of the polybutylene terephthalate resin (PBT) to the polycarbonate resin (PC) was 6:4.

Test products 1 (No. 1) and 6 (No. 6) to 11 (No. 11) are comparative products. Similarly to the products of the present invention, with regard to test product 1 (No. 1), the mass ratio of the polybutylene terephthalate resin (PBT) to the polycarbonate resin (PC) was 10:0. Similarly, for example, with regard to test product 11 (No. 11), the mass ratio of the polybutylene terephthalate resin (PBT) to the polycarbonate resin (PC) was 0:10.

Five samples of each of test products 1 to 11 as described above, which are the products of the present invention and the comparative products, were prepared. The test was performed as follows: The substrate transfer machine operated the operation portion 33 of the lid body 3 to remove the lid body 3 from the opening circumferential portion 28 of the container main body 2, and automatically removed the substrate. The results are shown in FIGS. 9 and 10.

As shown in FIG. 9, with regard to each of the products of the present invention (No. 2 to No. 5), when the lid body 3 was removed from the opening circumferential portion 28, the end edge of the substrate W slid on the lower inclined face 601 and moved to and was placed on the lower abutting face 603. In contrast, with regard to some of the comparative products (No. 1 and No. 6 to No. 11), the end edge of the substrate W slid on the lower inclined face 601 but did not move to the lower abutting face 603 and remained on the lower inclined face 601. Therefore, it can be seen that with regard to all of the products of the present invention, the friction coefficient was sufficiently small, and when the lid body 3 was removed from the opening circumferential portion 28 of the container main body 2, the end edge of the substrate W sufficiently slid on the lower inclined face 601, and the substrate W could be slid to a position at which the substrate transfer machine could automatically remove the substrate W.

Further, as shown in FIG. 10, with regard to all of the products of the present invention (No. 2 to No. 5), contamination due to generation of particles was suppressed when the lid body 3 was removed from the opening circumferential portion 28. For example, with regard to some samples of the product of the present invention (No. 2), contamination due to generation of particles was outside the standard range, but with regard to more than half of the samples of the product of the present invention, contamination due to generation of particles is within the standard range. Here, "within the standard range" means a level of color density due to particles, and ranges from 0 to 3.

In contrast, with regard to the comparative products (No. 1 and No. 6 to No. 11), the end edges of the substrates W of all samples of a comparative product were contaminated due to generation of particles outside the standard range.

Specifically, it can be seen that all samples of the comparative product (No. 1) were contaminated outside the standard range, and it can be seen that a lot of contamination was caused by generation of particles. As described above, the back side substrate support portion 6 and the wall portion 20 include an alloy resin mainly composed of a polycarbonate resin and a polybutylene terephthalate resin. The mass of the polybutylene terephthalate resin is greater than the mass of the polycarbonate resin. It can be seen that the material constituting the back side substrate support portion 6 and the wall portion 20 includes the polybutylene terephthalate resin in an amount of 51% by mass or more and less than 90% by mass with respect to the mass of the alloy resin, thereby extremely lowering the friction coefficient of the substrate W with respect to the lower inclined face 601 and suppressing contamination due to generation of particles.

According to the substrate storing container 1 of the embodiment having the above-described configuration, the following effects can be obtained. As described above, the back side substrate support portion 6 of the substrate storing container 1 includes the first abutting portion having the upper inclined face 602 as the first abutting face capable of abutting with the end edge of the front side of the substrate W, and the second abutting portion having the lower inclined face 601 as the second abutting face connected to the upper inclined face 602 and capable of abutting with the end edge of the back side of the substrate. When a state in which the container main body opening portion 21 is not closed by the lid body 3 is changed to a state in which the container main body opening portion 21 is closed by the lid body 3, and when the state in which the container main body opening portion 21 is closed by the lid body 3 is changed to the state in which the container main body opening portion 21 is not closed by the lid body 3, the substrate W slides on the second abutting face 601. The back side substrate support portion 6 includes the alloy resin mainly composed of the polycarbonate resin and the polybutylene terephthalate resin, and the mass of the polybutylene terephthalate resin is greater than the mass of the polycarbonate resin.

According to the above configuration, when the state in which the container main body opening portion 21 is closed by the lid body 3 is changed to the state in which the container main body opening portion 21 is not closed by the lid body 3, the substrate W can be moved to a predetermined position at which the substrate W is to be removed, and the substrate W can be automatically removed by the substrate transfer machine (not shown). In addition, contamination due to generation of particles can be suppressed during the movement. That is, according to the present embodiment, it is possible to realize the substrate storing container capable of allowing the substrate W to be automatically removed by the substrate transfer machine (not shown) and capable of suppressing contamination due to generation of particles during the movement.

Further, the material constituting the back side substrate support portion 6 includes the polybutylene terephthalate resin in an amount of greater than 40% by mass with respect to the mass of the alloy resin. This configuration enables the substrate W to be moved more reliably to a predetermined position at which the substrate W is to be removed. Therefore, the substrate transfer machine (not shown) can automatically remove the substrate W more reliably.

Further, the back side substrate support portion 6 includes the alloy resin mainly composed of the polycarbonate resin and the polybutylene terephthalate resin, and contains the polybutylene terephthalate resin in an amount of 51% by mass or more and less than 90% by mass with respect to the mass of the alloy resin. According to this configuration, it is possible to realize the substrate storing container capable of allowing the substrate W to be automatically removed by the substrate transfer machine (not shown) extremely reliably and capable of suppressing contamination due to generation of particles during the movement extremely reliably.

Further, the substrate storing container 1 includes the substrate support plate-like portions 5 disposed to form a pair in the substrate storing space 27. The substrate support plate-like portions 5 serve as the side substrate support portions and are capable of supporting the edge portions of the plurality of substrates W in a state in which the adjacent substrates among the plurality of substrates W are spaced apart from each other by a predetermined interval and arranged in parallel when the container main body opening portion 21 is not closed by the lid body 3. The back side substrate support portion 6 supports the plurality of substrates W in a state in which the edge portions of the plurality of substrates W are separated from the substrate support plate-like portions 5 and are arranged in parallel, in cooperation with the front retainer 7 serving as the lid body side substrate support portion when the container main body opening portion 21 is closed by the lid body 3.

According to the above configuration, it is possible to realize the substrate storing container 1 capable of the following: When changing to a state in which the back side substrate support portion 6 and the front retainer 7 cooperate to support the substrate W or when changing to a state in which they do not support the substrate W, the sliding of the end edge of the substrate W on the second abutting face 601 is facilitated, and thereby the substrate W can be automatically removed by the substrate transfer machine (not shown) more reliably, and contamination due to generation of particles during the movement can be suppressed more reliably.

When the container main body opening portion 21 is closed by the lid body 3, the lower inclined face 601 serving as the first abutting face and the upper inclined face 602 serving as the second abutting face support the substrate W so as to sandwich the end edge of the substrate W.

According to the above configuration, when a state in which the lower inclined face 601 and the upper inclined face 602 sandwich the end edge of the substrate W is changed to a state in which the container main body opening portion 21 is not closed by the lid body 3 and the lower inclined face 601 and the upper inclined face 602 do not sandwich the end edge of the substrate W, the end edge of the substrate W can be slid on the lower inclined face 601 reliably and the substrate W can be more reliably moved to a predetermined position at which the substrate W is to be removed.

The present invention is not limited to the embodiment described above, and can be modified within the technical scope of the claims.

For example, in the present embodiment, the substrate W slides on the second abutting face 601 both when a state in which the container body opening portion 21 is not closed by the lid body 3 is changed to a state in which the container body opening portion 21 is closed by the lid body 3, and when the state in which the container body opening portion 21 is closed by the lid body 3 is changed to the state in which the container body opening portion 21 is not closed by the lid body 3, but the present invention is not limited thereto. That is, the substrate W may slide on the second abutting face 601 at least when the state in which the container body opening portion 21 is not closed by the lid body 3 is changed to the state in which the container body opening portion 21 is closed by the lid body 3 or when the state in which the container body opening portion 21 is closed by the lid body 3 is changed to the state in which the container body opening portion 21 is not closed by the lid body 3.

Further, for example, the shapes of the container main body and the lid body, and the number and dimensions of the substrates W that can be stored in the container main body are not limited to the shapes of the container main body 2 and the lid body 3 and the number and dimensions of the substrates W that can be stored in the container main body 2 in the present embodiment. That is, the features of the side substrate support portion, the lid body side substrate support portion, and the back side substrate support portion are not limited to the features of the substrate support plate-like portion 5, the front retainer 7, and the back side substrate support portion 6. Further, although the substrate W in the present embodiment is a silicon wafer having a diameter of 300 mm, the diameter of the substrate is not limited to this value.

EXPLANATION OF REFERENCE NUMERALS 1 substrate storing container
2 container main body
3 lid body
5 substrate support plate-like portion (side substrate support portion)
6 back side substrate support portion
7 front retainer (lid body side substrate support portion)
20 wall portion
21 container main body opening portion
27 substrate storing space
28 opening circumferential portion
601 lower inclined face
602 upper inclined face
W substrate

The invention claimed is:

1. A substrate storing container, comprising:
a container main body having a tubular wall portion having an opening circumferential portion provided at one end portion and the other end portion being closed, the opening circumferential portion having a container main body opening portion formed therein, the wall portion having an inner face forming a substrate storing space capable of storing a plurality of substrates and communicating with the container main body opening portion;
a lid body removably attached to the container main body opening portion and capable of closing the container main body opening portion;
a lid body side substrate support portion disposed on a part of the lid body that faces the substrate storing space and capable of supporting edge portions of the plurality of substrates when the container main body opening portion is closed by the lid body; and
a back side substrate support portion disposed so as to form a pair with the lid body side substrate support portion in the substrate storing space, capable of supporting edge portions of the plurality of substrates, and supporting the plurality of substrates in a state in which the plurality of substrates are arranged in parallel, in cooperation with the lid body side substrate support portion when the container main body opening portion is closed by the lid body,
wherein the back side substrate support portion comprises a first abutting portion having a first abutting face capable of abutting with an end edge of a front side of one of the plurality of substrates and a second abutting portion having a second abutting face capable of abutting with an end edge of a back side of the one of the plurality of substrates, the second abutting face being connected to the first abutting face,
wherein the plurality of substrates slide on a plurality of the second abutting faces when a state in which the container main body opening portion is not closed by the lid body is changed to a state in which the container main body opening portion is closed by the lid body and when the state in which the container main body opening portion is closed by the lid body is changed to the state in which the container main body opening portion is not closed by the lid body, wherein when the state in which the container main body opening portion is closed by the lid body is changed to the state in which the container main body opening portion is not closed by the lid body, the end edges of all of the plurality of substrates are caused to automatically slide on the plurality of the second abutting faces so that all of the plurality of substrates move to, and become placed on, lower abutting faces connected to the plurality of the second abutting faces, thereby allowing the plurality of substrates to be automatically removed by a substrate transfer machine, wherein the back side substrate support portion comprises an alloy resin consisting of a polycarbonate resin and a polybutylene terephthalate resin, and a mass of the polybutylene terephthalate resin is greater than that of the polycarbonate resin, and wherein a material constituting the back side substrate support portion comprises the polybutylene terephthalate resin in an amount of 51% by mass or more with respect to a mass of the alloy resin.

2. The substrate storing container according to claim 1, wherein the back side substrate support portion comprises the alloy resin mainly composed of the polycarbonate resin and the polybutylene terephthalate resin, and contains the polybutylene terephthalate resin in an amount of 51% by mass or more and less than 90% by mass with respect to the mass of the alloy resin.

3. The substrate storing container according to claim 1, further comprising side substrate support portions disposed to form a pair in the substrate storing space, the side substrate support portions being capable of supporting edge portions of the plurality of substrates in a state in which adjacent substrates among the plurality of substrates are spaced apart from each other by a predetermined interval and arranged in parallel when the container main body opening portion is not closed by the lid body, wherein the back side substrate support portion supports the plurality of substrates in a state in which the edge portions of the plurality of substrates are separated from the side substrate support portions and are arranged in parallel, in cooperation with the lid body side substrate support portion when the container main body opening portion is closed by the lid body.

4. The substrate storing container according to claim 1, wherein the first abutting face and the second abutting face support the one of the plurality of substrates so as to sandwich an end edge of the one of the plurality of substrates when the container main body opening portion is closed by the lid body.

* * * * *